United States Patent
Radhakrishnan et al.

(10) Patent No.: US 10,950,555 B2
(45) Date of Patent: Mar. 16, 2021

(54) ULTRA-LOW PROFILE PACKAGE SHIELDING TECHNIQUE USING MAGNETIC AND CONDUCTIVE LAYERS FOR INTEGRATED SWITCHING VOLTAGE REGULATOR

(71) Applicant: Intel Corporation, Santa Clara, CA (US)

(72) Inventors: Kaladhar Radhakrishnan, Gilbert, AZ (US); Jaejin Lee, Beaverton, OR (US); Hao-Han Hsu, Portland, OR (US); Chung-Hao J. Chen, Portland, OR (US); Dong-Ho Han, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/481,031

(22) PCT Filed: Mar. 30, 2017

(86) PCT No.: PCT/US2017/025208
§ 371 (c)(1),
(2) Date: Jul. 25, 2019

(87) PCT Pub. No.: WO2018/182656
PCT Pub. Date: Oct. 4, 2018

(65) Prior Publication Data
US 2019/0393165 A1 Dec. 26, 2019

(51) Int. Cl.
*H01L 23/66* (2006.01)
*H01L 23/552* (2006.01)
(Continued)

(52) U.S. Cl.
CPC ........ *H01L 23/552* (2013.01); *H01L 21/4803* (2013.01); *H01L 21/4846* (2013.01);
(Continued)

(58) Field of Classification Search
CPC ... H01L 23/12; H01L 23/14; H01L 23/49816; H01L 23/5225; H01L 23/5227;
(Continued)

(56) References Cited

U.S. PATENT DOCUMENTS 5,864,088 A * 1/1999 Sato ...................... H01L 23/552
174/386
8,907,498 B2 * 12/2014 Pagaila ............. H01L 23/49816
257/777

(Continued)

FOREIGN PATENT DOCUMENTS

| KR | 10-2012-0026979 | 3/2012 |
| KR | 10-2014-0129259 | 11/2014 |
| KR | 10-2015-0127369 | 11/2015 |

OTHER PUBLICATIONS

International Preliminary Report on Patentability for International Patent Application No. PCT/US2017/025208, dated Oct. 10, 2019, 6 pgs.

(Continued)

*Primary Examiner* — Stephen W Smoot
(74) *Attorney, Agent, or Firm* — Schwabe, Williamson & Wyatt, P.C.

(57) ABSTRACT

Semiconductor packages and a method of forming a semiconductor package are described. The semiconductor package has a foundation layer, a conductive layer formed in the foundation layer, and a magnetic layer formed between the conductive and the foundation layer. The conductive layer and the magnetic layer are coupled to form a low-profile inductor shield. The semiconductor package also has a (Continued)

dielectric layer formed between the magnetic and foundation layer. The foundation layer is mounted between a motherboard and a semiconductor die, where the foundation layer is attached to the motherboard with solder balls. Accordingly, the low-profile inductor shield may include a z-height that is less than a z-height of the solder balls. The low-profile inductor shield may have solder pads that are coupled to the conductive layer. The foundation layer may include at least one of voltage regulator and inductor, where the inductor is located above the low-profile inductor shield.

25 Claims, 11 Drawing Sheets

(51) Int. Cl.
    *H01L 21/48*      (2006.01)
    *H01L 23/498*      (2006.01)
    *H01L 25/18*      (2006.01)
    *H05K 1/18*      (2006.01)
    *H01L 23/64*      (2006.01)
    *H01L 49/02*      (2006.01)

(52) U.S. Cl.
    CPC .. *H01L 23/49816* (2013.01); *H01L 23/49838* (2013.01); *H01L 23/645* (2013.01); *H01L 23/66* (2013.01); *H01L 25/18* (2013.01); *H01L 28/10* (2013.01); *H05K 1/181* (2013.01); *H05K 1/183* (2013.01); *H01L 2223/6661* (2013.01); *H01L 2223/6666* (2013.01); *H05K 2201/086* (2013.01); *H05K 2201/09072* (2013.01)

(58) Field of Classification Search
    CPC ..... H01L 23/552; H01L 23/645; H01L 23/66; H01L 2223/6661; H01L 28/10; H05K 1/181; H05K 1/182; H05K 1/183; H05K 1/185; H05K 3/303; H05K 2201/086
    See application file for complete search history.

(56) References Cited

U.S. PATENT DOCUMENTS

| | | | |
|---|---|---|---|
| 9,030,841 B2 | 5/2015 | Arnold et al. | |
| 9,706,661 B2 | 7/2017 | Choi | |
| 9,723,766 B2 | 8/2017 | Yin et al. | |
| 9,781,834 B1* | 10/2017 | Sturcken | H01F 17/0033 |
| 2013/0105950 A1 | 5/2013 | Bergemont et al. | |
| 2014/0239443 A1* | 8/2014 | Gallagher | C23C 18/50 |
| | | | 257/531 |
| 2016/0057897 A1* | 2/2016 | Malek | H05K 9/0024 |
| | | | 361/752 |
| 2016/0343672 A1 | 11/2016 | Yang et al. | |
| 2017/0250134 A1* | 8/2017 | Sturcken | H01F 41/0206 |

OTHER PUBLICATIONS

International Search Report and Written Opinion for International Patent Application No. PCT/US2017/025208 dated Dec. 27, 2017, 7 pgs.

* cited by examiner

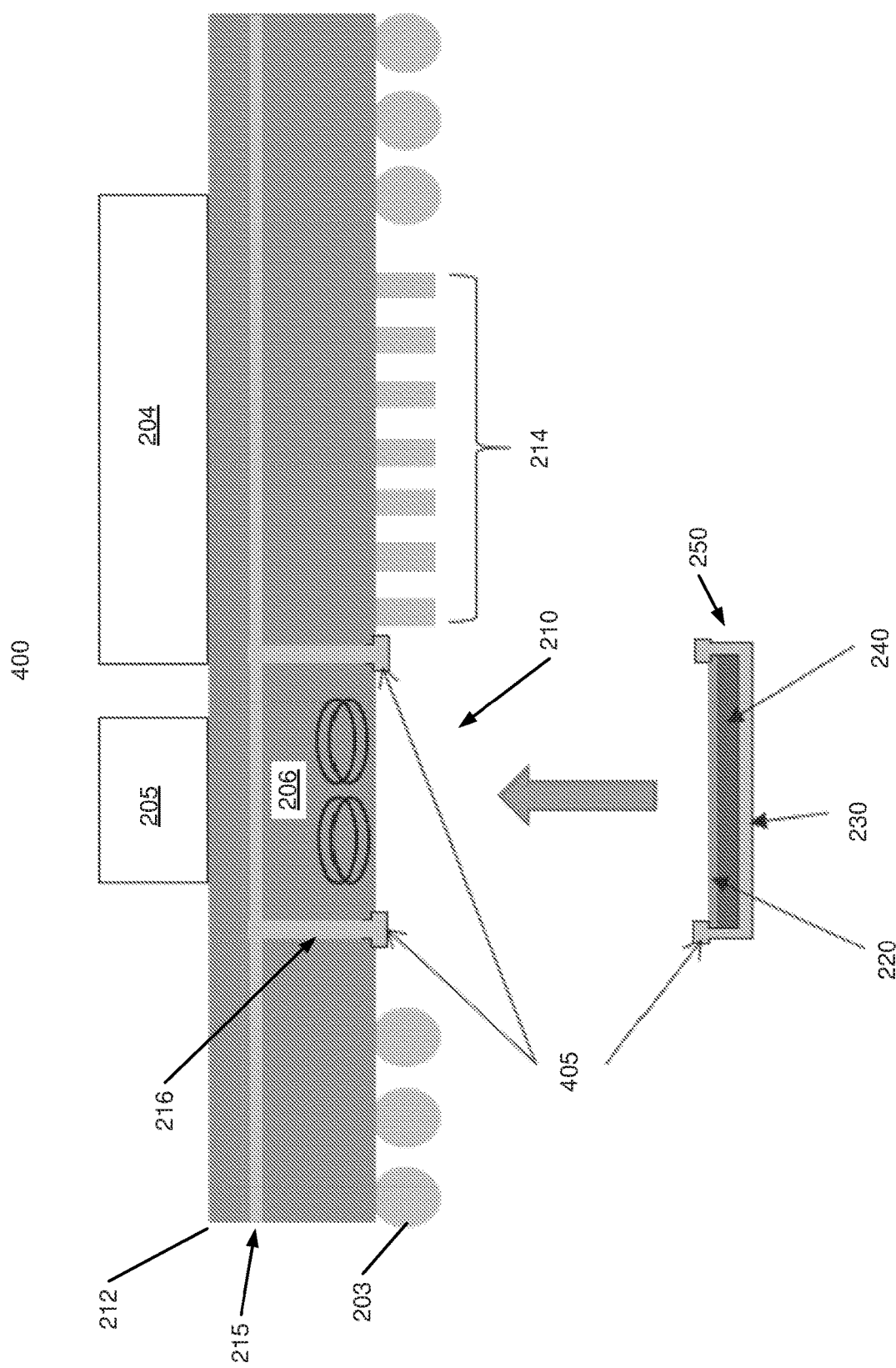

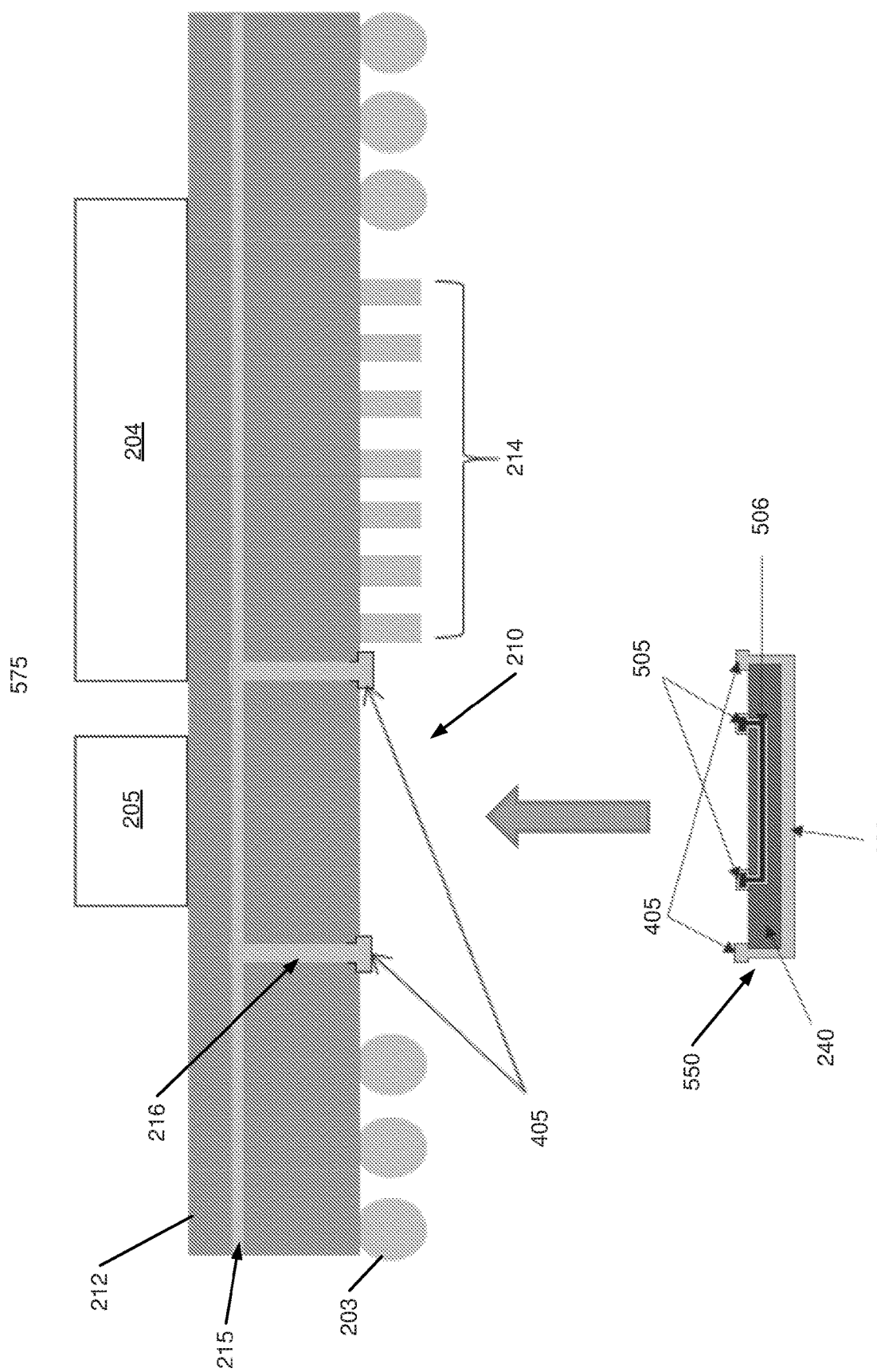

| | ACI | ACI/Cu sputter shield | | ACI/magnet/Cu sputter shield |
|---|---|---|---|---|
| Keep-out-zone (KOZ) distance | - | 80 µm | 240 µm | 80 µm |
| L (nH) at 150 MHz | 0.94 | 0.62 (-34%) | 0.80 (-15%) | 0.98 (+4%) |
| Q at 150 MHz | 20.3 | 16.5 (-19%) | 19.9 (-2%) | 19.1 (-6%) |
| Coupling coefficient and shielding effectiveness, SE (dB) at 2450 MHz | -54.5 | -82.6 (SE: 28.1 dB) | -82.7 (SE: 28.2 dB) | -85.8 (SE: 31.3 dB) |
| EMI Margin (dB) | -14 (EMI fail) | +14 (EMI pass) | +14 (EMI pass) | +17 (EMI pass) |

FIG. 6

ULTRA-LOW PROFILE PACKAGE SHIELDING TECHNIQUE USING MAGNETIC AND CONDUCTIVE LAYERS FOR INTEGRATED SWITCHING VOLTAGE REGULATOR

CROSS-REFERENCE TO RELATED APPLICATION

This patent application is a U.S. National Phase Application under 35 U.S.C. § 371 of International Application No. PCT/US2017/025208, filed Mar. 30, 2017, entitled "ULTRA-LOW PROFILE PACKAGE SHIELDING TECHNIQUE USING MAGNETIC AND CONDUCTIVE LAYERS FOR INTEGRATED SWITCHING VOLTAGE REGULATOR," which designates the United States of America, the entire disclosure of which is hereby incorporated by reference in its entirety and for all purposes.

FIELD

Embodiments relate to packaging for electronic devices. More particularly, the embodiments relate to packaging solutions with magnetic and conductive layers for an inductor in an integrated switching voltage regulator that provides electromagnetic interference (EMI) and radio frequency interference (RFI) mitigation.

BACKGROUND

Integrated circuits (ICs), such as integrated switching voltage regulators (VRs), present several problems. One such problem is that the VRs generate large switching harmonic noise and cause EMI and RFI issues. Large switching harmonic noise is typically propagated from non-shielded VR inductors in system-on-chip (SOC) package to motherboard. Another problem is that harmonic noise may increase EMI regulatory violations, LTE antenna desense, and WiFi throughput degradation.

As an effective approach, packaging solutions typically shield the VR inductors with an on-board Faraday cage (or an EMI shield enclosure) in SOC packages to suppress the EMI and RFI of the integrated VRs. The on-board Faraday cage is used to suppress (or block) EMI and RFI noise from the VR inductors. The Faraday cage, however, significantly increases the z-height of the overall system. This presents additional problems for packaging solutions, especially for small form factor designs. FIG. 1 illustrates these problems.

FIG. 1 is a cross-sectional view of a typical semiconductor package assembly 100 that includes a shielding solution. As shown in FIG. 1, a typical semiconductor package assembly 100 includes a motherboard 101, a foundation layer 102 (or a package/substrate), a semiconductor die 104, an integrated switching voltage regulator 105 (hereinafter referred to as "VR"), a VR inductor 106 (hereinafter referred to as "inductor"), and an enclosure 107. The VR 105 and inductor 106 on foundation layer 102 generate EMI/RFI noises and can cause antenna desense, data throughput degradation, and EMI regulatory violations. Conventionally, the enclosure 107 (e.g., an on-board Faraday cage, an EMI shield, etc.) is used to suppress EMI and RFI noise to the surrounding components of the typical semiconductor IC package 100.

This typical approach, however, has resulted in some problems. One problem of this approach is that the enclosure 107 has a large keep-out-zone (KOZ) distance. The KOZ distance is the z-height protruding from the land side of the foundation layer 102 to the enclosure 107. This large KOZ distance embedded in the motherboard 101, the foundation layer 102, and the enclosure 107 is unused and thus considered wasted in terms of PCB area utilization. Another problem of this approach is that the z-height of the enclosure 107 (or the KOZ distance) is typically a limiting factor in small form factor package designs, including single-side PCBs and low-profile computing systems.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 4 is a cross-sectional view illustration of a method of forming a low-profile inductor shield with a magnetic layer and a conductive layer in a foundation layer, according to one embodiment.

FIG. 5B is a cross-sectional view illustration of a method of forming a low-profile inductor shield with a magnetic inductor array and a magnetic layer in a foundation layer, according to an alternative embodiment.

FIG. 6 is a table illustrating performance and inductor characteristics for one or more inductors, according to one embodiment.

DETAILED DESCRIPTION

A semiconductor package is described herein that includes a foundation layer. The semiconductor package further includes a conductive layer that is formed in the foundation layer. The semiconductor package also includes a magnetic layer that is formed between the conductive layer and the foundation layer. Accordingly, the conductive layer and the magnetic layer are coupled to form a low-profile inductor shield that can suppress EMI and RFI noise (e.g., large switching VR harmonic noise emitted from the foundation layer).

Embodiments of the low-profile inductor shield (also referred to as an ultra-low profile inductor shield, a low-profile electrical shield, an ultra-low profile electrical shield, etc.) enhance packaging solutions. Embodiments of the low-profile inductor shield help to implement ultra-low profile shielding techniques for integrated switching VR applications.

Embodiments of the low-profile inductor shield provide improvements and benefits to semiconductor packages using integrated VRs, such as a low-profile EMI/RFI shielding, a small keep-out-zone (KOZ) distance, and a large shielding effectiveness without inductor Q-factor and inductance degradation. Embodiments of the low-profile inductor shield suppress (or block) VR harmonic noise radiation from the foundation layer and, therefore, can eliminate on-board EMI/RFI shields (e.g., on-board Faraday cages, metal shields/enclosures, etc.). Embodiments of the low-profile inductor shield maintain the same package routing design and thus facilitate overall packaging implementation.

Embodiments of the low-profile inductor shield help to enable EMI and RFI mitigation when a conventional discrete component, such as a land-side capacitor (LSC), is not feasible due to a z-height constraint. Embodiments of the low-profile inductor shield help to implement an ultra-low profile packaging process to suppress harmonic noise in the package without increasing z-height, cost, and total number of discrete components. Embodiments of the low-profile inductor on the foundation layer help to overcome the limitations on shrinking packages associated with the z-height of motherboards, discrete components, and solder balls. Accordingly, embodiments of the low-profile inductor shield increase the flexibility of platform design and help design innovative small form-factor systems with reduced EMI/RFI noise (e.g., smartphones, tablets, notebooks, Internet of Things (IOT) devices, wearable devices, etc.).

Figure 2A:
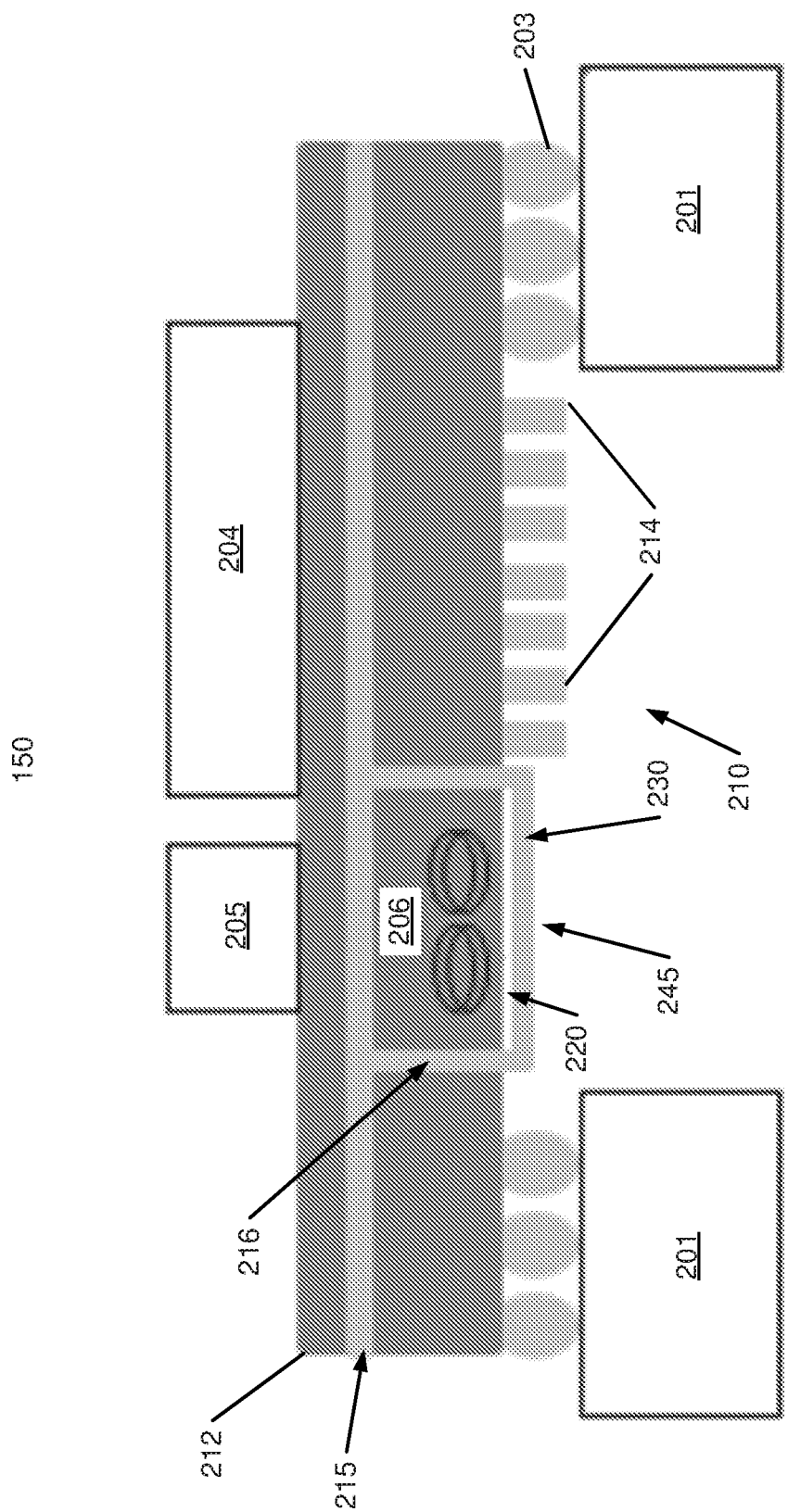
FIG. 2A is a cross-sectional view of a semiconductor package that includes a motherboard, a semiconductor die, and a foundation layer with a low-profile inductor shield, according to one embodiment.

FIG. 2A is a cross-sectional view of semiconductor package 150 that includes motherboard 201, semiconductor die 204, and foundation layer 212 with low-profile inductor shield 245.

Motherboard 201 has hole in motherboard (HiMB) 210. As used herein, the abbreviation "HiMB" not only refers to a hole in a motherboard, but also can refer to a recess or a cavity in a motherboard. An "HiMB" is formed under semiconductor die 204 shadow and the land-side of foundation layer 212 to accommodate LSCs 214 with a large z-height profile. As used herein, a "z-height" refers to a unit of measurement on the z-axis in a three-dimensional package, which is usually oriented vertically. Further, an HiMB is often accompanied with a shield (e.g., low-profile inductor shield 250 of FIG. 2B). As used herein, a "low-profile inductor shield" refers to a shield enclosure—typically a copper shield enclosure—implemented with VRs to suppress (or shield off) the EMI and RFI to the surrounding components of foundation layer 212 (or semiconductor packages 150 and 200). Further, a "low-profile inductor shield" refers to an EMI/RFI shield for integrated VRs, which may include a magnetic layer 240, a conductive layer 230, and a dielectric layer (or spacer) 220 formed on a foundation layer 212. The "low-profile inductor shield" (or ultra, low-profile inductor shield) also refers to a z-height of the "low-profile inductor shield" that is less than a z-height of collapsed solder balls (e.g., ~100 μm<<~300 μm, respectively). As used herein, a "foundation layer" refers to, but is not limited to, a package (a system-on-chip (SOC) package), a substrate, a motherboard, and a printed circuit board (PCB).

Referring now to FIG. 2A. According to an alternative embodiment, semiconductor package 150 has low-profile inductor shield 245 but semiconductor package 150 does not include magnetic layer 240 between inductors 206 and conductive layer 230, as illustrated with low-profile inductor shield 250 of FIGS. 2B-C. Semiconductor package 150 is similar to semiconductor package 200 of FIGS. 2B-2C. As such, the low-profile inductor shield 245 may be similar to low-profile inductor shield 250 of FIGS. 2B-C (e.g., pertaining to the conductive material and the total thickness (or z-height) of the shield), yet the low-profile inductor shield 245 omits magnetic layer 240 and thus may not have the large shielding effectiveness (and other inductor characteristics) as illustrated with low-profile inductor shield 250 of FIGS. 2B-C.

Foundation layer 212 is mounted on motherboard 201. For one embodiment, foundation layer 212 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). Foundation layer 212 is patterned to form one or more conductive copper traces and pads (not shown) on the top and bottom of foundation layer 212. For some embodiments, holes (not shown) may be drilled in foundation layer 212.

Foundation layer 212 resides (or is mounted) between motherboard 201 and semiconductor die 204. For another embodiment, foundation layer 212 may have a package/substrate (not shown) that is mounted above foundation layer 212, where the semiconductor die 204 is mounted on the package/substrate rather than on foundation layer 212. For one embodiment, semiconductor die 204 includes, but not limited to, an integrated circuit, a CPU, a microprocessor, and a platform controller hub (PCH).

For one embodiment, foundation layer 212 has VR 205 and inductor 206 (as described in further detail below in FIGS. 2B-C). For one embodiment, foundation layer 212 may include LSCs 214 to decouple one or more interferences (e.g., EMI and RFI) generated by semiconductor die 204. Semiconductor die 204 may be attached to foundation layer 212 using solder balls or controlled collapse chip connection (C4) bumps (not shown) that connect pads on semiconductor die 204 and foundation layer 212.

For one embodiment, motherboard 201 is also made of a multilayer PCB having copper traces, holes, and metallic pads (not shown). Motherboard 201 may have one or more electronic components, such as microprocessors (or CPUs), memories, ICs, and microelectronics devices, that are mounted/located on the motherboard 201.

Foundation layer 212 is attached to motherboard 201 through the use of solder balls (or bumps) 203 that connect pads (not shown) on foundation layer 212 and motherboard 201. For example, solder balls 203 may be used on a ball grid array (BGA). Note that other methods of connectivity packaging may also be used such as pin grid array (PGA) or land grid array (LGA).

Note that semiconductor package 150 may include fewer or additional packaging components based on the desired packaging design.

Figures 2B, 2C:
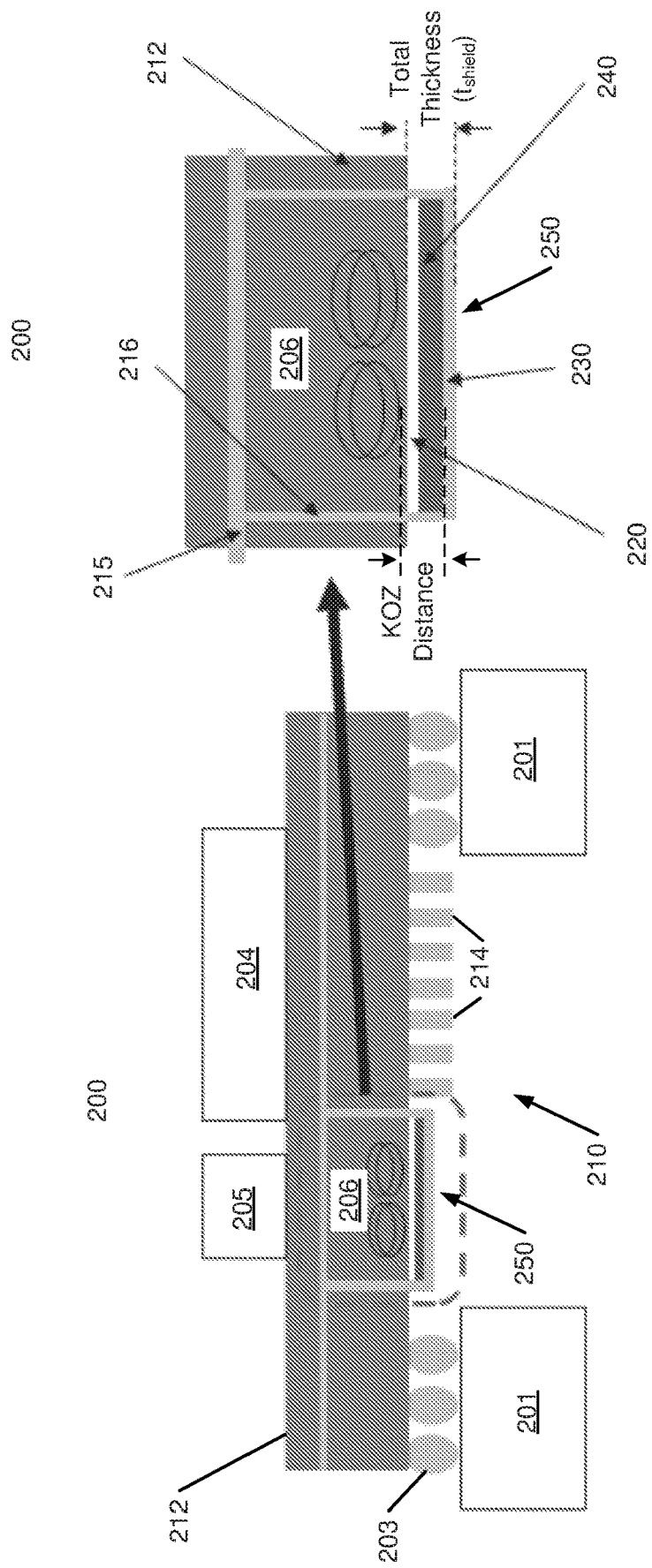
FIG. 2B is a cross-sectional view of a semiconductor package that includes a motherboard, a semiconductor die, and a foundation layer with a low-profile inductor shield that further includes a magnetic layer and a conductive layer, according to one embodiment.
FIG. 2C is a close-up of a cross-sectional view of a semiconductor package with a foundation layer that includes a low-profile inductor shield that further includes a magnetic layer and a conductive layer, according to one embodiment.

Referring now to FIGS. 2B-C. FIG. 2B is a cross-sectional view of semiconductor package 200 that includes motherboard 201, semiconductor die 204, and foundation layer 212 with low-profile inductor shield 250 (also referred to as a low-profile EMI/RFI shield). Meanwhile, FIG. 2C is a close-up, detailed cross-sectional view of low-profile inductor shield 250 formed on foundation layer 212 of semiconductor package 200.

For one embodiment, semiconductor package 200 has foundation layer 212, motherboard 201, semiconductor die 204, and low-profile inductor shield 250. Foundation layer 212 is mounted above motherboard 201. For some embodiments, foundation layer 212 is mounted between semiconductor die 204 and motherboard 201. Foundation layer 212 may include one or more LSCs 214 mounted on the land-side of foundation 212 and under semiconductor die 204.

According to some embodiments, motherboard 201 is formed with HiMB 210. HiMB 210 may be a circular hole, a square hole, a triangle, a rectangle, or any shape. For one embodiment, HiMB 210 is a square (or rectangular) hole with one or more sidewalls. Note that number of sidewalls will be proportional to the selected shape of HiMB 210 (e.g., a circular hole may have one sidewall, a triangular hole may have three sidewalls, etc.).

For one embodiment, foundation layer 212 has VR(s) 205 and inductor(s) 206. The VR 205 and inductor 206 may be formed in (or mounted on) the foundation layer 212. For example, VR 205 may be mounted on foundation layer 212 and adjacent to semiconductor die 204, while inductor 206 is formed on one or more layers (not shown) of foundation layer 212.

For one embodiment, VR 205 (integrated switching voltage regulator) may include one or more voltage regulators formed on foundation layer 212. Note that VR 205 may also be referred to as a switching/switched mode voltage regulator, a voltage regulator, a switching power stage, a switch mode direct current (DC) DC-DC controller, etc. As used herein, a "VR" may refer to a component that generates a constant DC output/supply voltage (e.g., Vcc) and contains circuits which keep the output voltage on a supplied load at a regulated value. Typically, this task is accomplished using a switching power stage of VR 205 that toggles drivers and switches within VR 205.

Likewise, for one embodiment, inductor 206 (integrated switching voltage regulator inductor) may include one or more inductors formed on foundation layer 212. Note that inductor 206 may also be referred to as a switching/switched mode VR inductor, a VR inductor, a switching power stage inductor, an output inductor, etc. As used herein, an "inductor" may refer to a component that is coupled to VR 205 (or any DC-DC controller) and may be used to stabilize (or smooth out) the supply voltage by effectively reducing ripples created by the VR 205.

For most embodiments, VR 205 coupled with inductor 206 generate large switching EMI and RFI noise. Accordingly, foundation layer 212 is formed with low-profile inductor shield 250. Low-profile inductor shield 250 includes, but is not limited to, a dielectric layer 220, a magnetic layer 240, and a conductive layer 230. Low-profile inductor shield 250 may be a metal shield (e.g., a copper (Cu) shield) that has one or more metal pads (not shown) (e.g., solder pads or EMI shielding assembly pads). The metal pads (e.g., solder pads 405 of FIG. 4) may be located along the ends (or side walls) of low-profile shield 250.

Low-profile inductor shield 250 may be, but is not limited to, a metal plate/sheet, a metal screen, a metal foam, a metal mesh, an ultra, low-profile Faraday cage, etc., or any other type of material used for EMI/RFI shielding (e.g., a plastic shield coated with a metallic ink or similar material).

For one embodiment, solder balls 203 collapse to form collapsed solder balls with a reduced z-height (e.g., ~300 µm) as foundation layer 212 is mounted on motherboard 201. Low-profile inductor shield 250 (or ultra, low-profile inductor shield) is thus formed to have a z-height (e.g., ~100 µm) that is less than the z-height of the collapsed solder balls (e.g., ~300 µm), which helps to overcome the z-height constraints associated with package miniaturization. For another embodiment, low-profile inductor shield 250 is mounted below (or on the land-side of) foundation layer 212. In particular, low-profile inductor shield 250 is mounted below inductor 206 to shield off (or block) the EMI and RFI to the surrounding components of semiconductor package 200.

For example, foundation layer 212 shows that the low-profile inductor shield 250 is formed on the same plane as foundation layer 212, as shown in FIG. 2C. As such, for some embodiments, the one or more layers 220, 230, and 240 of low-profile inductor shield 250 are formed on the same plane as foundation layer 212, rather than having an on-board Faraday cage to increase the z-height constraints of HiMB 210, solder balls 203, and semiconductor package 250. Having the overall z-height of semiconductor package 250 diminished with the ultra, low-profile (i.e., z-height or total thickness of shield measuring about 100 µm) of inductor shield 250 is advantageous because the drive to meet the need for miniaturization is achieved, while facilitating small form-factor system designs with suppressed EMI and RFI.

FIG. 2C shows a detailed view of low-profile inductor shield 250, which is formed on foundation layer 212 of semiconductor package 200.

As shown in FIG. 2C, low-profile inductor shield 250 is formed below inductor 206 of foundation layer 212. Low-profile inductor shield 250 is coupled with foundation layer 212 with vias 216, which are then coupled with ground 215 of foundation layer 212.

Low-profile inductor shield 250 has dielectric layer 220, magnetic layer 240, and conductive layer 230. For one embodiment, low-profile inductor shield 250 also has solder pads (e.g., as shown with solder pads 405 of FIG. 4) that are coupled to solder pads (not shown) of foundation layer 212, which are coupled with vias 216 and ground 215 of foundation layer 212.

Conductive layer 230 is a copper shield that forms the outer shield (or EMI/RFI shield) of the low-profile inductor shield 250. Conductive layer 230 is coupled with vias 216 of foundation layer 212 to enable an ultra, low-profile EMI/RFI enclosure located right on the land-side of foundation layer 212. For some embodiments, magnetic layer 240 is formed between dielectric layer 220 and conductive layer 230 of low-profile inductor shield 250. Accordingly, the magnetic layer 240 is formed (or mounted) between inductor(s) 206 and conductive layer 230 to reduce eddy current loss.

The magnetic layer 240 also helps to minimize inductance and Q-factor degradation with a small KOZ distance. In addition, magnetic layer 240 can be used to increase inductance due to large magnetic permeability (e.g., $\mu r \gg 1$), which can result in inductor miniaturization. Likewise, according to some embodiments, the dielectric layer 220 is formed above magnetic layer 240 and conductive layer 230 of low-profile inductor shield 250. Accordingly, the dielectric layer 220 is formed (or mounted) between inductor(s)

206 and magnetic layer 240 to reduce magnetic loss impact on the Q-factor of inductor(s) 206.

For one embodiment, the inductor 206 and VR 205 are mounted (or formed) parallel to HiMB 210 of motherboard 201. For one embodiment, once low-profile inductor shield 250 is formed (or implemented), the low-profile inductor shield 250 is mounted below foundation layer 212 and embedded in HiMB 210, as the one or more assembly (or solder) pads of low-profile inductor shield 250 are coupled with the one or more solder pads of foundation layer 212 (as shown in FIGS. 4-5). Accordingly, for example, the embedded low-profile inductor shield 250 forms a KOZ distance of 80 μm and a total thickness ($t_{shield}$) of 100 μm. The KOZ is the z-height distance between inductor 206 and conductive layer 230, and $t_{shield}$ is the z-height distance between the land side of foundation layer 212 and the bottom of conductive layer 230 (i.e., $t_{shield}$ is the total thickness measurement of the low-profile inductor shield 250).

Figure 1:
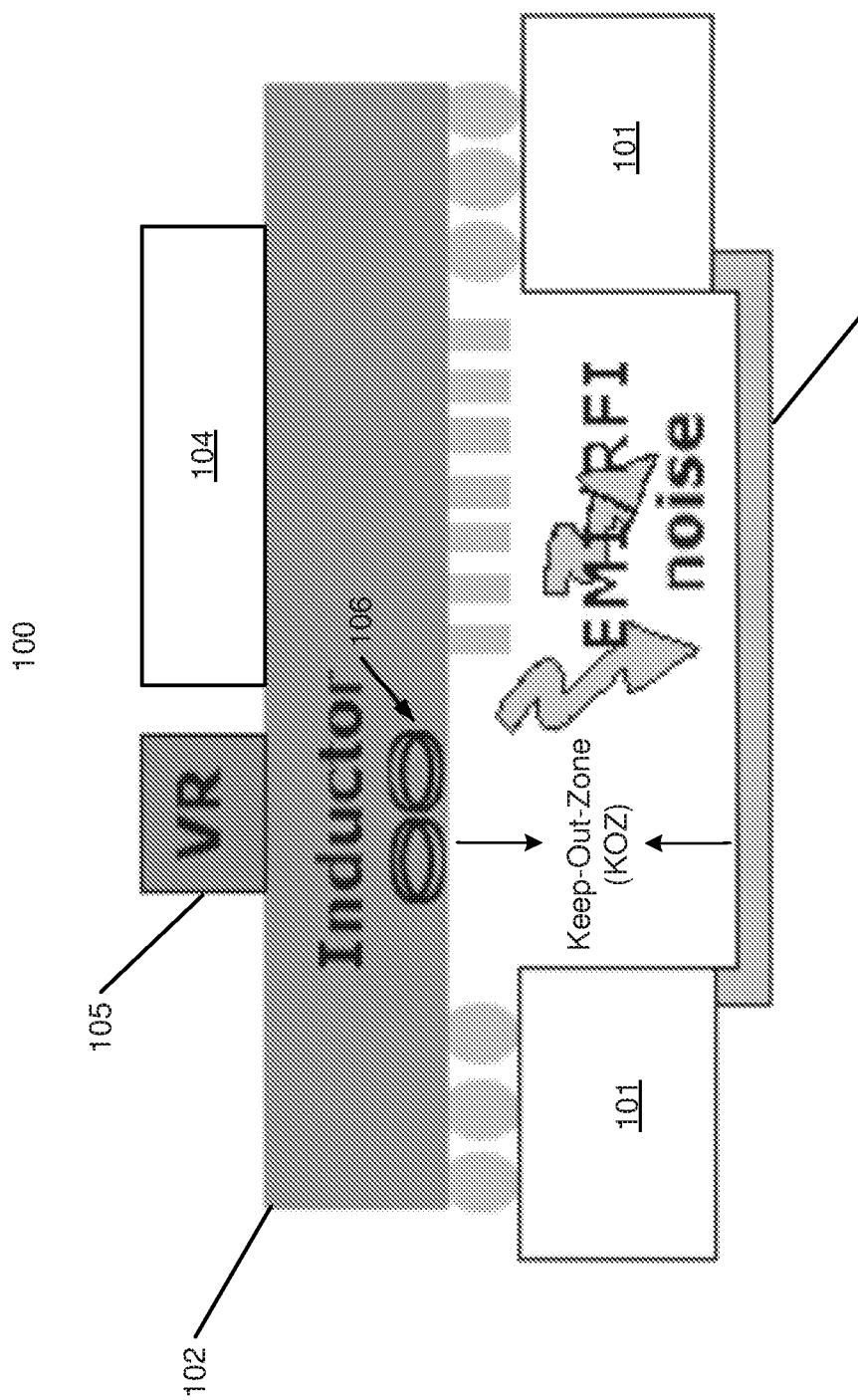
FIG. 1 is a cross-sectional view of a typical semiconductor package that includes a typical shielding solution.

Having the low-profile inductor shield 250 formed below inductor 206 and VR 205 on the land side of foundation layer 212 helps to suppress the VR harmonic noise radiation of the foundation layer 212 and, therefore, can also eliminate a need for on-board EMI/RFI shields (e.g., Faraday cage 107 of FIG. 1). This approach (or ultra-low profile package shielding technique) is advantageous to low-profile and small form-factor systems, including tablets, smart phones, and wearable devices.

In addition, having the overall dimensions of semiconductor package 200 mitigated is advantageous because no additional assembly or part(s) is required, and as such the manufacturing (e.g., original equipment manufacturing (OEM)) complexity and uncertainty is drastically reduced.

For certain embodiments, forming/mounting low-profile inductor shield 250 below foundation layer 212 and within HiMB 210 of motherboard 201 help to facilitate a low-profile package shielding (or ultra-low profile package shielding) for semiconductor package 200. As used herein, a "low-profile package shielding" (also referred to as "low-profile package shielding process") refers to a small form factor package design that uses magnetic and conductive layers for integrated switching VR applications. This "low-profile package shielding" helps to suppress EMI and RFI to the package, which reduces EMI/RFI risk for a customer's platforms, reduces regulatory violations, and allows customers to meet radio specification requirements.

Furthermore, mounting low-profile inductor shield 250 directly below foundation layer 212 and within the sidewalls of HiMB 210 with a reduced KOZ distance is even more suitable for smaller form factors, as the dimensions of the package and solder balls keep shrinking. Having low-profile inductor shield 250 formed near inductor 206, VR 205, semiconductor die 204, and foundation layer 212 rather than using an on-board Faraday cage is advantageous because the proximity (i) reduces the x-y dimensions of the overall package; (ii) improves noise reduction as parasitic inductance generated by vias and routings is minimized; (iii) improves shielding effectiveness (e.g., ~30 dB) by suppressing the switching VR noise emission from the package; and (iv) provides a negligible impact on inductor characteristics (as shown in FIG. 6).

Note that semiconductor package 200 may include fewer or additional packaging components based on the desired packaging design.

Figure 3:
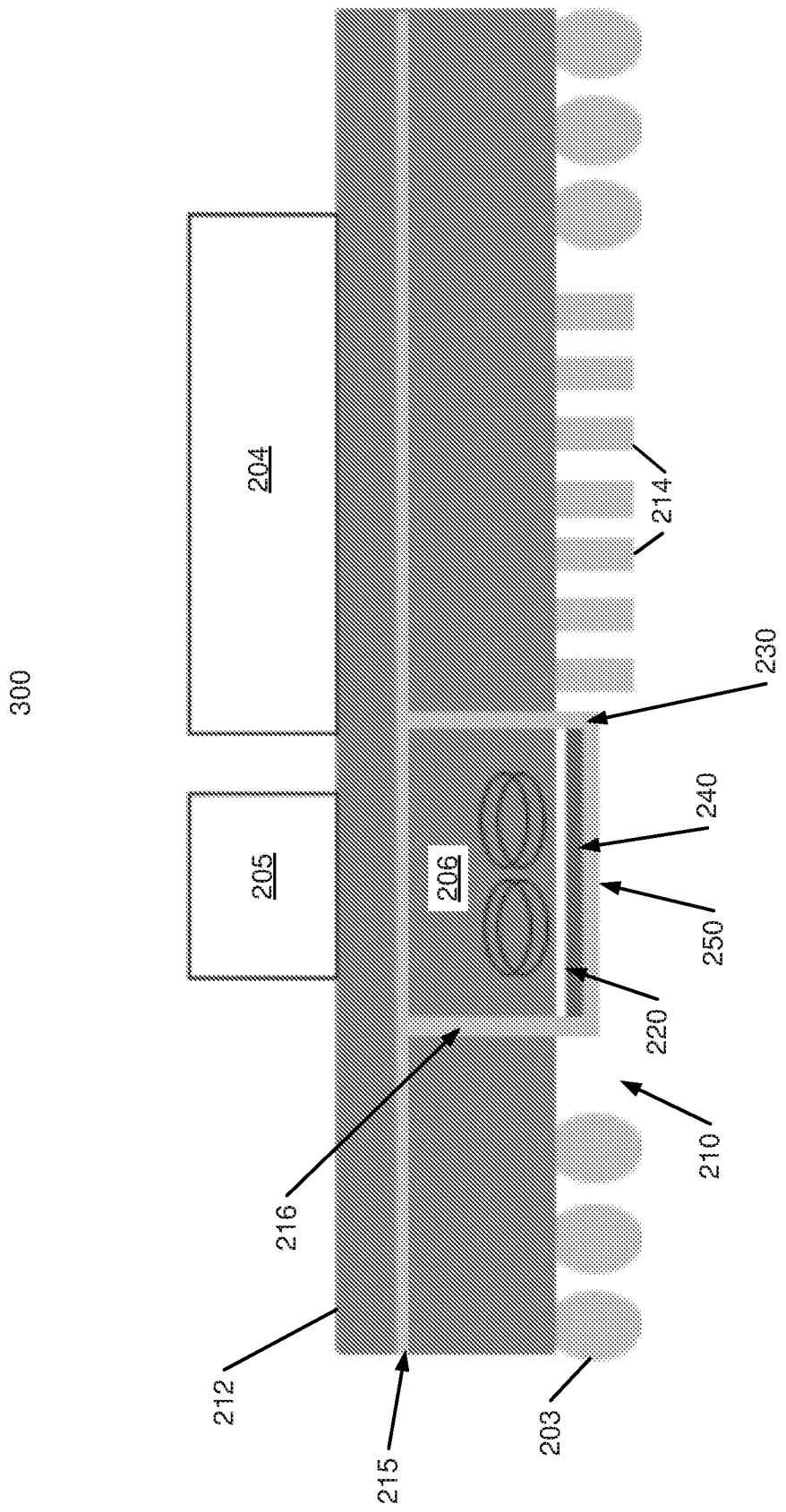
FIG. 3 is a cross-sectional view of a semiconductor package that includes a semiconductor die and a foundation layer with a low-profile inductor shield that further includes a magnetic layer and a conductive layer, according to one embodiment.

Referring now to FIGS. 3-4. FIG. 3 shows a semiconductor package 300 that includes foundation layer 212 with low-profile inductor shield 250 that is formed (or implemented) with a sputtered process. FIG. 4 shows a semiconductor package 400 that includes foundation layer 212 with low-profile inductor shield 250 that is formed (or assembled) with a surface mount technology (SMT) process. Semiconductor package 300 of FIG. 3 is similar to semiconductor package 200 of FIGS. 2B-C. Semiconductor package 400 of FIG. 4 is similar to semiconductor package 200 of FIGS. 2B-C and semiconductor package 300 of FIG. 3. As illustrated in FIGS. 3-4, low-profile inductor shield 250 may be formed and assembled on foundation layer 212 using a sputtering process, a SMT process, or the like.

FIG. 3 is a cross-sectional view of a method of forming a low-profile inductor shield 250 with a dielectric layer 220, a magnetic layer 240, and a conductive layer 230 in a foundation layer 212. Foundation layer 212 includes semiconductor die 204, VR 205, inductor 206, LSCs 214, solderballs 203, and low-profile inductor shield 250.

Low-profile inductor shield 250 has dielectric layer 220, magnetic layer 240, and conductive layer 230. Low-profile inductor shield 250 can be formed on foundation layer 212 (or SOC package) with a sputtering process, or the like. For some embodiments, each of dielectric layer 220, magnetic layer 240, and conductive layer 230 is sputtered-deposited on foundation layer 212. For example, dielectric layer 220 may be formed below foundation layer 212, and magnetic layer 240 may then be formed (sputtered-deposited) below dielectric layer 220. Lastly, continuing with the above example, conductive layer 230 is formed below the magnetic layer 240 and thus surrounds dielectric layer 220 and magnetic layer 240 (i.e., dielectric layer 220 and magnetic layer 240 are embedded within conductive layer 230). Accordingly, low-profile inductor shield 250 is formed as conductive layer 230 is coupled with vias 216, which are coupled with ground 215. Once conductive layer 230 is coupled with vias 216, the conductive layer 230 of the low-profile inductor shield 250 forms an EMI/RFI copper shield that suppresses harmonic noise radiated from foundation layer 212.

For some embodiments, dielectric layer 220 can be air or any dielectric material, such as a polymer material (e.g., polyimide, epoxy or build-up film (BF)). In addition, dielectric layer 220 can also be an existing solder mask material on foundation layer 212, which can eliminate additional processing for semiconductor package 300.

For some embodiments, magnetic layer 240 is implemented with large permeability, low-magnetic loss, and high-resistivity materials. As such, magnetic layer 240 may include hexagonal ferrite ($Co_2Z$) which provides a high permeability (e.g., μr~7), a low magnetic loss (e.g., tan δ~0.01), and a high resistivity (e.g., ~$10^8$ Ω·cm) below 150 MHz. For other embodiments, magnetic layer 240 may include, but is not limited to, any other types of ferrites, magnetic composites, and other magnetic materials.

Note that semiconductor package 300 may include fewer or additional packaging components based on the desired packaging design. In addition, note that low-profile inductor shield 250 of semiconductor package 300 is applicable to any types of semiconductor packages that use integrated VRs with inductors (e.g., VRs 205 and inductors 206).

FIG. 4 is a cross-sectional view illustration of a method of forming a low-profile inductor shield 250 with a dielectric layer 220, a magnetic layer 240, and a conductive layer 230 in a foundation layer 212. Foundation layer 212 includes semiconductor die 204, VR 205, inductor 206, LSCs 214, solderballs 203, and low-profile inductor shield 250.

Low-profile inductor shield 250 has dielectric layer 220, magnetic layer 240, and conductive layer 230. For other embodiments, a SMT process may be used to assemble (or mount) the low-profile inductor shield 250 on foundation layer 212, which includes one or more LSCs 214 (e.g., ceramic LTCC decoupling capacitors). Note that using the SMT implementation does not require any additional steps or changes to the routing design of foundation layer 212. As described above, low-profile inductor shield 250 of semiconductor package 400 is similar to low-profile inductor shield 250 of semiconductor packages 200 and 300 (as shown in FIGS. 2-3).

According to some embodiments, low-profile inductor shield 250 may be formed on foundation layer 212 (or SOC package) with a SMT process, or the like. For some embodiments, each of dielectric layer 220, magnetic layer 240, and conductive layer 230 are mounted together to form low-profile inductor shield 250. For example, conductive layer 230 may be formed to a specific shape and/or size based on the desired packaging design. Magnetic layer 240 may then be formed (e.g., printed, etched, molded, sputtered-deposited, etc.) above conductive layer 230. Lastly, dielectric layer 220 is formed above magnetic layer 240 and conductive layer 230. The dielectric layer 220 may be formed using air, a dielectric spacer, an existing solder mask material on foundation layer 212, or the like. Note that using the existing solder mask material on foundation layer 212 can eliminate additional processing for semiconductor package 400.

Continuing with the above example, conductive layer 230 is formed to surround dielectric layer 220 and magnetic layer 240 (i.e., dielectric layer 220 and magnetic layer 240 are embedded within conductive layer 230). Once low-profile inductor shield 250 is formed, one or more solder pads 405 of low-profile inductor shield 250 are then mounted (or assembled) on one or more solder pads 405 of foundation layer 212 (as shown with the arrow). Low-profile inductor shield 250 is thus formed as the one or more solder pads 405 on conductive layer 230 are coupled to the one or more solder pads 405 on vias 216, which are coupled with ground 215. When conductive layer 230, vias 216, solder pads 405, and ground 215 are each coupled on foundation layer 212, the conductive layer 230 of the low-profile inductor shield 250 forms an EMI/RFI copper shield that suppresses harmonic noise radiated from foundation layer 212.

For some embodiments, dielectric layer 220 (also referred to as dielectric spacer) can be any type of dielectric material, such as air, solder mask material, or a polymer material (e.g., polyimide, epoxy or build-up film (BF)). For some embodiments, magnetic layer 240 is implemented with large permeability, low-magnetic loss, and high-resistivity materials. As such, magnetic layer 240 may include hexagonal ferrite ($Co_2Z$) which provides a high permeability (e.g., $\mu r \sim 7$), a low magnetic loss (e.g., $\tan \delta \sim 0.01$), and a high resistivity (e.g., $\sim 10^8$ $\Omega \cdot cm$) below 150 MHz. For other embodiments, magnetic layer 240 may include, but is not limited to, any other types of ferrites, magnetic composites, and other magnetic materials.

Note that semiconductor package 400 may include fewer or additional packaging components based on the desired packaging design. In addition, note that low-profile inductor shield 250 of semiconductor package 400 is applicable to any types of semiconductor packages that use integrated VRs with inductors (e.g., VRs 205 and inductors 206).

Figure 5A:
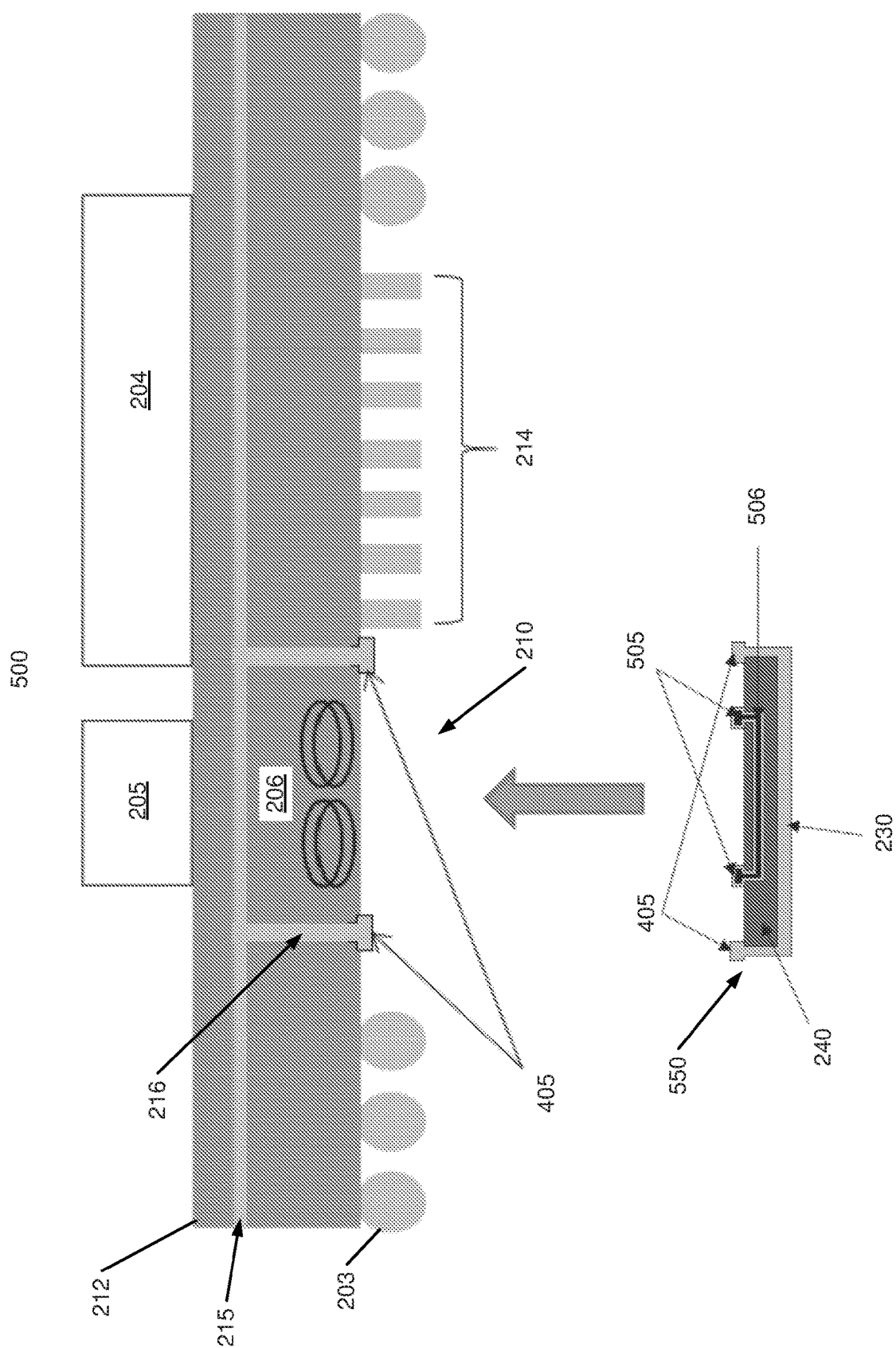
FIG. 5A is a cross-sectional view illustration of a method of forming a low-profile inductor shield with a magnetic inductor array and a magnetic layer in a foundation layer, according to another embodiment.

Referring now to FIGS. 5A-B. FIG. 5A is a cross-sectional view illustration of a method of forming a low-profile inductor shield 550 with a magnetic inductor array (MIA) 506 in a foundation layer 212. FIG. 5B is a cross-sectional view illustration of a method of forming a low-profile inductor shield 550 with a MIA 506 in a foundation layer 212.

FIG. 5A shows a semiconductor package 500 that includes low-profile inductor shield 550 with MIA 506 and inductor 206 formed on foundation layer 212. Alternatively, FIG. 5B shows a semiconductor package 575 that includes low-profile inductor shield 550 with MIA 506 and foundation layer 212—without an inductor. Semiconductor package 500 of FIG. 5A is similar to semiconductor package 200 of FIGS. 2B-C. Semiconductor package 575 of FIG. 5B is similar to semiconductor package 200 of FIGS. 2B-C and semiconductor package 500 of FIG. 5A, however the inductor(s) 506 are formed on the low-profile inductor shield 550 (and not on the foundation layer 212). As illustrated in FIGS. 5A-B, low-profile inductor shield 550 may be formed and assembled on foundation layer 212 using a sputtering process, a SMT process, or the like.

FIG. 5A is a cross-sectional view of a method of forming a low-profile inductor shield 550 with a magnetic layer 240, a conductive layer 230, one or more solder pads 405, a MIA 506, and one or more MIA pads 505. Foundation layer 212 includes semiconductor die 204, VR 205, inductor 206, LSCs 214, solderballs 203, and low-profile inductor shield 250.

For some embodiments, MIA 506 may be any type of magnetic inductor array, such as a wire bridge embedded in a high permeability magnetic material (e.g., magnetic layer 240). As such, with this shielding approach, the VR switching harmonic noise radiated from the MIA 506 can be suppressed and thus EMI/RFI risk can be significantly reduced.

According to some embodiments, low-profile inductor shield 550 of semiconductor package 500 is similar to low-profile inductor shield 250 of semiconductor packages 200 and 300 (as shown in FIGS. 2-3). Low-profile inductor shield 550, however, includes a MIA 506 that is embedded within magnetic layer 240 and conductive layer 230.

According to some embodiments, low-profile inductor shield 550 may be formed on foundation layer 212 (or SOC package) with a SMT process, or the like. For some embodiments, each of magnetic layer 240, MIA 506, and conductive layer 230 are mounted together to form low-profile inductor shield 550. For example, conductive layer 230 may be formed to a specific shape and/or size based on the desired packaging design. MIA 506 may then be formed, for example, as a wire bridge that is embedded in (or within) magnetic layer 240. Magnetic layer 240 is thus formed (e.g., printed, etched, molded, sputtered-deposited, etc.) above MIA 506 and conductive layer 230. Lastly, a dielectric layer (not show) may be formed above magnetic layer 240 and conductive layer 230.

Continuing with the above example, conductive layer 230 is formed to surround MIA 506 and magnetic layer 240 (i.e., MIA 506 and magnetic layer 240 are embedded within conductive layer 230). In addition, MIA 506 may include one or more MIA pads, which can be coupled with one or more inductor pads (not shown) on foundation layer 212.

Once low-profile inductor shield 550 is formed, one or more solder pads 405 of low-profile inductor shield 550 are then mounted (or assembled) on one or more solder pads 405 of foundation layer 212 (as shown with the arrow). Low-profile inductor shield 550 is thus formed as the one or more solder pads 405 on conductive layer 230 are coupled to the one or more solder pads 405 on vias 216, which are coupled with ground 215. When conductive layer 230, vias 216, solder pads 405, and ground 215 are each coupled to foundation layer 212 (and when MIA pads 505 are coupled to VR circuit of foundation layer 212), the conductive layer 230 of the low-profile inductor shield 550 then forms an EMI/RFI copper shield that suppresses harmonic noise radiated from foundation layer 212.

For some embodiments, magnetic layer 240 is implemented with large permeability, low-magnetic loss, and high-resistivity materials. As such, magnetic layer 240 may include hexagonal ferrite ($Co_2Z$) which provides a high permeability (e.g., $\mu r\sim 7$), a low magnetic loss (e.g., tan $\delta\sim 0.01$), and a high resistivity (e.g., $\sim 10^8$ Ω·cm) below 150 MHz. For other embodiments, magnetic layer 240 may include, but is not limited to, any other types of ferrites, magnetic composites, and other magnetic materials.

Note that semiconductor package 500 may include fewer or additional packaging components based on the desired packaging design. In addition, note that low-profile inductor shield 550 of semiconductor package 500 is applicable to any types of semiconductor packages that use integrated VRs with inductors (e.g., VRs 205 and inductors 206).

FIG. 5B is a cross-sectional view of a method of forming a low-profile inductor shield 575 with a magnetic layer 240, a conductive layer 230, one or more solder pads 405, a MIA 506, and one or more MIA pads 505. Foundation layer 212 includes semiconductor die 204, VR 205, LSCs 214, solderballs 203, and low-profile inductor shield 250.

For some embodiments, MIA 506 may be any type of magnetic inductor array, such as a wire bridge embedded in a high permeability magnetic material (e.g., magnetic layer 240). As such, with this shielding approach, the VR switching harmonic noise radiated from the MIA 506 can be suppressed and thus EMI/RFI risk can be significantly reduced. In addition, semiconductor package 575 may use the MIA 506 of low-profile inductor shield 250, rather than having inductors formed on the foundation layer 212. This approach may reduce the overall z-height of the package and the total number of components of the package, while having a low-profile EMI/RFI shield.

Low-profile inductor shield 550 of semiconductor package 575 is similar to low-profile inductor shield 550 of semiconductor packages 500, as shown in FIG. 5A. For some embodiments, low-profile inductor shield 550 of semiconductor package 575 is similar to low-profile inductor shield 250 of semiconductor packages 200 and 300 (as shown in FIGS. 2-3). Low-profile inductor shield 550, however, includes a MIA 506 that is embedded within magnetic layer 240 and conductive layer 230.

According to some embodiments, low-profile inductor shield 550 may be formed on foundation layer 212 (or SOC package) with a SMT process, or the like. For some embodiments, each of magnetic layer 240, MIA 506, and conductive layer 230 are mounted together to form low-profile inductor shield 550. For example, conductive layer 230 may be formed to a specific shape and/or size based on the desired packaging design. MIA 506 may then be formed, for example, as a wire bridge that is embedded in (or within) magnetic layer 240. Magnetic layer 240 is thus formed (e.g., printed, etched, molded, sputtered-deposited, etc.) above MIA 506 and conductive layer 230. Lastly, a dielectric layer (not show) may be formed above magnetic layer 240 and conductive layer 230.

Continuing with the above example, conductive layer 230 is formed to surround MIA 506 and magnetic layer 240 (i.e., MIA 506 and magnetic layer 240 are embedded within conductive layer 230). In addition, MIA 506 may include one or more MIA pads, which can be coupled with one or more inductor pads (not shown) on foundation layer 212.

Once low-profile inductor shield 550 is formed, one or more solder pads 405 of low-profile inductor shield 550 are then mounted (or assembled) on one or more solder pads 405 of foundation layer 212 (as shown with the arrow). Low-profile inductor shield 550 is thus formed as the one or more solder pads 405 on conductive layer 230 are coupled to the one or more solder pads 405 on vias 216, which are coupled with ground 215. When conductive layer 230, vias 216, solder pads 405, and ground 215 are each coupled to foundation layer 212 (and when MIA pads 505 are coupled to VR circuit of foundation layer 212), the conductive layer 230 of the low-profile inductor shield 550 then forms an EMI/RFI copper shield that suppresses harmonic noise radiated from foundation layer 212.

For some embodiments, magnetic layer 240 is implemented with large permeability, low-magnetic loss, and high-resistivity materials. As such, magnetic layer 240 may include hexagonal ferrite ($Co_2Z$) which provides a high permeability (e.g., $\mu r\sim 7$), a low magnetic loss (e.g., tan $\delta\sim 0.01$), and a high resistivity (e.g., $\sim 10^8$ Ω·cm) below 150 MHz. For other embodiments, magnetic layer 240 may include, but is not limited to, any other types of ferrites, magnetic composites, and other magnetic materials.

Note that semiconductor package 575 may include fewer packaging components (e.g., fewer inductors) or additional packaging components based on the desired packaging design. In addition, note that low-profile inductor shield 550 of semiconductor package 575 is applicable to any types of semiconductor packages that use integrated VRs with inductors (e.g., VRs 205).

FIG. 6 is a table 600 illustrating performance and inductor characteristics for one or more inductor configurations 601-603. Table 600 shows, for example, three different inductor configurations on a foundation layer, such as an air core inductor (ACI) 601, an ACI with a conductive layer (ACI/Cu sputter shield) 602, and ACI with a conductive layer and a magnetic layer 603 (ACI/magnet/Cu sputter shield). For example, ACI 601 may be illustrated with a typical semiconductor package without an on-board Faraday cage or any other EMI/RFI shield (like typical semiconductor package 100 of FIG. 1, but without on-board Faraday cage 107). Likewise, ACI/Cu sputter shield 602 may be illustrated with semiconductor package 150 of FIG. 2A. For another example, ACI/magnet/Cu sputter shield 603 may be illustrated with semiconductor package 200 of FIG. 2B.

Table 600 also illustrates performance and inductor characteristics, such as KOZ distance, inductance (L), Q-factor, shielding effectiveness (SE), and EMI margin. For some embodiments, ACI/magnet/Cu sputter shield 603 illustrates the performance and inductor characteristics of low-profile inductor shield 250 of FIG. 2B. Accordingly, the effect of a low-profile inductor shield on inductor characteristics is assessed and compared to ACI 601 (i.e., no-shielding) and ACI/Cu sputter shield 602. For example, the low-profile Cu shield 602 is the same structure as a low-profile inductor shield, as described herein, but has no magnetic layer between the inductors and conductive layer (as shown in FIG. 2A).

With an 80 μm KOZ, the ACI/magnet/Cu sputter shield 603 shows a negligible impact on inductor characteristics as compared to those of ACI 601 with no-shielding. On the other hand, the conductive layer (Cu shield) shows large decreases in L and Q-factor (e.g., 34% and 19%, respectively) at KOZ of 80 μm, which may be due to a large eddy current loss. To reduce the impact, the KOZ for the ACI/Cu shield 602 may increase its KOZ to greater than 240 μm. Meanwhile, the low-profile package shielding technique, as described herein, of ACI/magnet/Cu sputter shield 603 can decrease its z-height greater than 200% compared to the low-profile ACI/Cu shield 602. Also note that a small increase in L may be obtained with the low-profile package shielding technique, resulting in inductor miniaturization.

Accordingly, table 600 summarizes improvements and benefits of forming a magnetic layer between an inductor and a conductive layer (i.e., forming a low-profile inductor shield 250 of FIG. 2A), as compared to using different inductor configurations without a magnetic layer in between.

Figure 7:
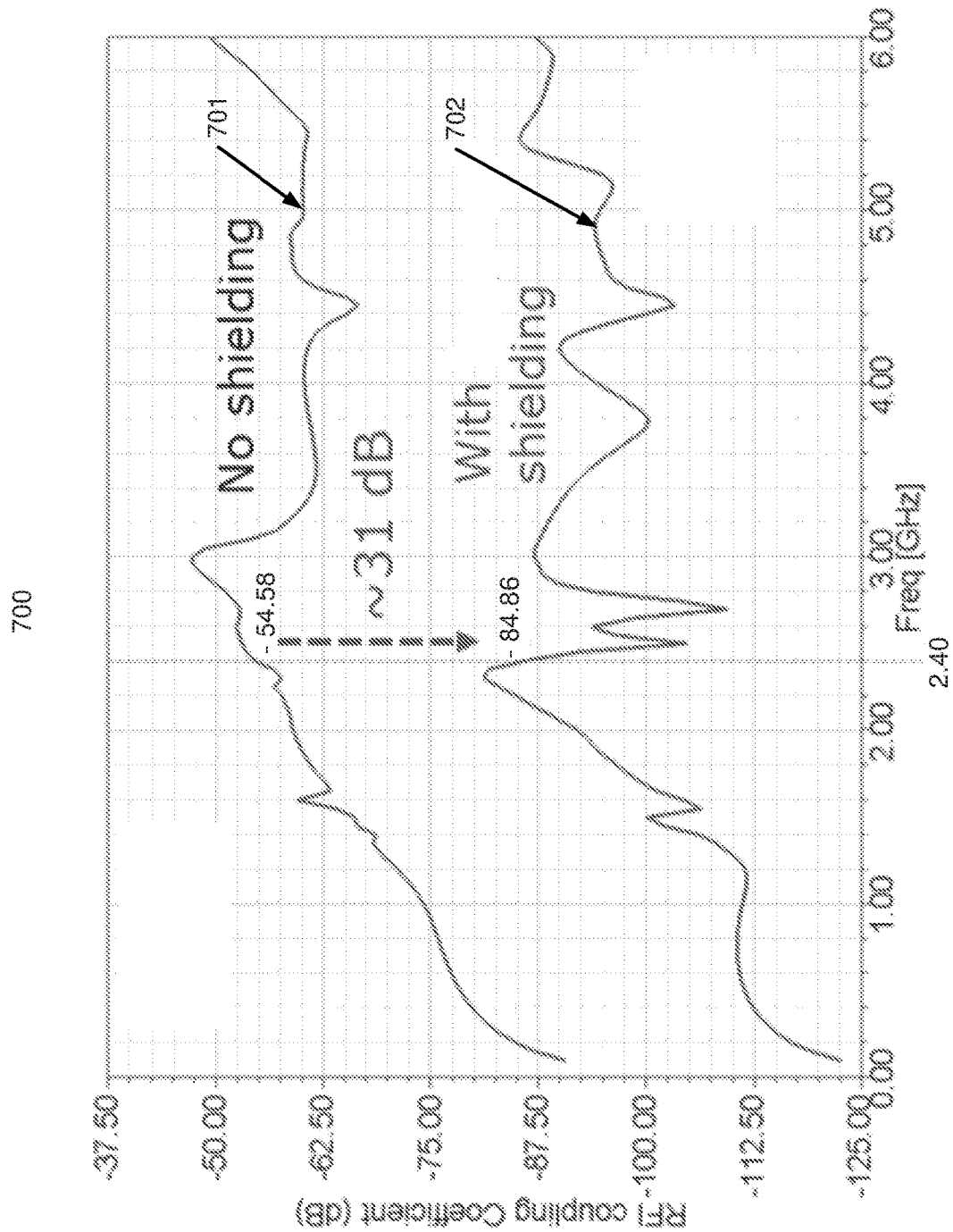
FIG. 7 is a graph illustrating RFI coupling coefficient comparisons of a conventional semiconductor package with no shielding and a semiconductor package with a low-profile inductor shield, according to one embodiment.

FIG. 7 is a graph 700 illustrating RFI coupling coefficient comparisons of a conventional semiconductor package with no shielding 601 and a semiconductor package with a low-profile inductor shield 602. Further, graph 700 illustrates the RFI coupling coefficient versus frequency using no shielding 701 (e.g., a foundation layer without an EMI/RFI shield) and with shielding 702 (e.g., a foundation layer with an EMI/RFI shield, such as low-profile inductor shield 250 of FIG. 2A).

Graph 700 illustrates a large shielding effectiveness of 31 db with shielding 702 in the wide frequency range of radio bands (e.g., LTE and WiFi radio bands). For example, using a low-profile inductor shielding 702, the noise emission can be significantly suppressed by ~31 dB as compared to the no-shielding case. This is a significant noise reduction (>>90%) in the wide frequency range, which cover LTE and WiFi radio bands. In addition, the large shielding effectiveness of ~31 dB might significantly reduce regulatory violations (e.g., a large shielding effectiveness provides a flexible EMI margin over regulatory violations).

As such, graph 700 illustrates improvements and benefits of a low-profile inductor shield (e.g., low-profile inductor shield 250 of FIG. 2A), as compared to using an inductor configuration that does not include a conductive nor a magnetic layer.

Figure 8:
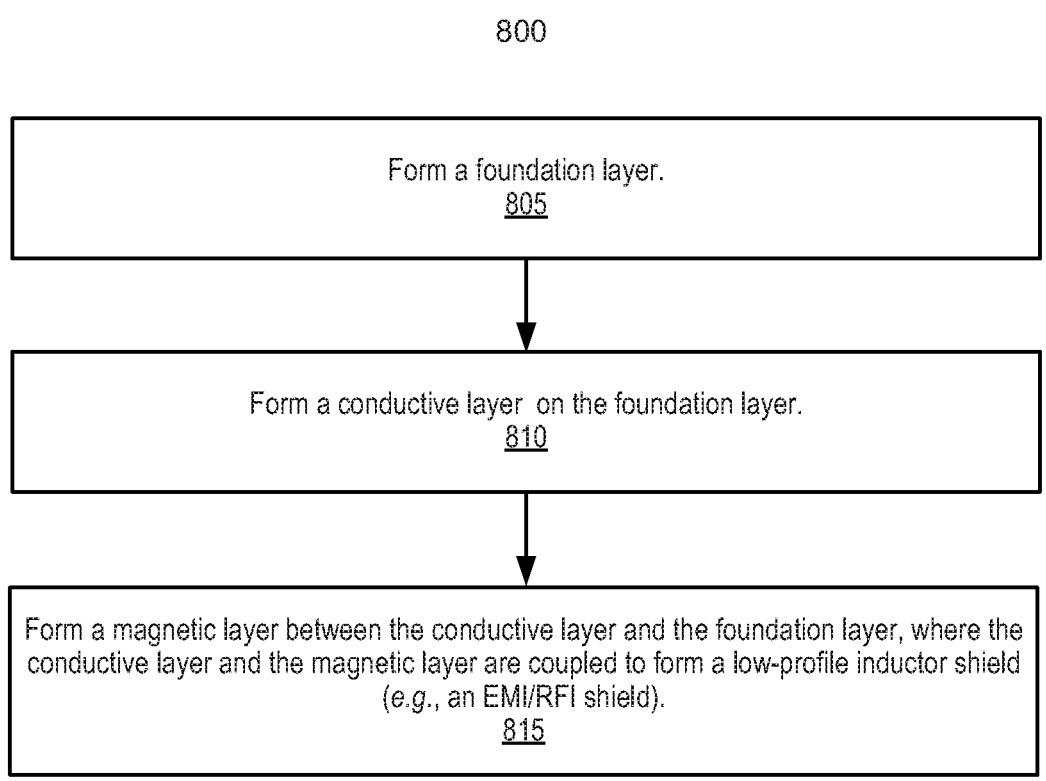
FIG. 8 is a process flow illustrating a method of forming a low-profile inductor shield with a magnetic layer and a conductive layer in a foundation layer, according to one embodiment.

FIG. 8 is a process flow 800 illustrating a method of forming a low-profile inductor shield with a magnetic layer and a conductive layer in a foundation layer, as shown in FIGS. 2B-4. For one embodiment, process flow 800 may implement a sputtering-depositing process (as shown in FIG. 3) and a SMT process (as shown in FIG. 4).

At block 805, process flow forms a foundation layer. At block 810, process flow forms a conductive layer on the foundation layer. For example, a conductive layer may be formed on the land-side of a foundation layer, as shown in FIG. 3. Then, at block 815, process flow forms a magnetic layer between the conductive layer and the foundation layer. At block 815, the conductive layer and the magnetic layer are coupled to form a low-profile inductor shield. For example, as shown in FIG. 3, the magnetic layer (e.g., magnetic layer 240) is formed between the conductive layer (e.g., conductive layer 230) and the foundation layer (e.g., foundation layer 212), as the conductive and magnetic layers are coupled to form the low-profile inductor shield (e.g., low-profile inductor shield 250). Accordingly, the low-profile inductor shield may suppress EMI/RFI that is generated by the foundation layer and the package.

Figure 9:
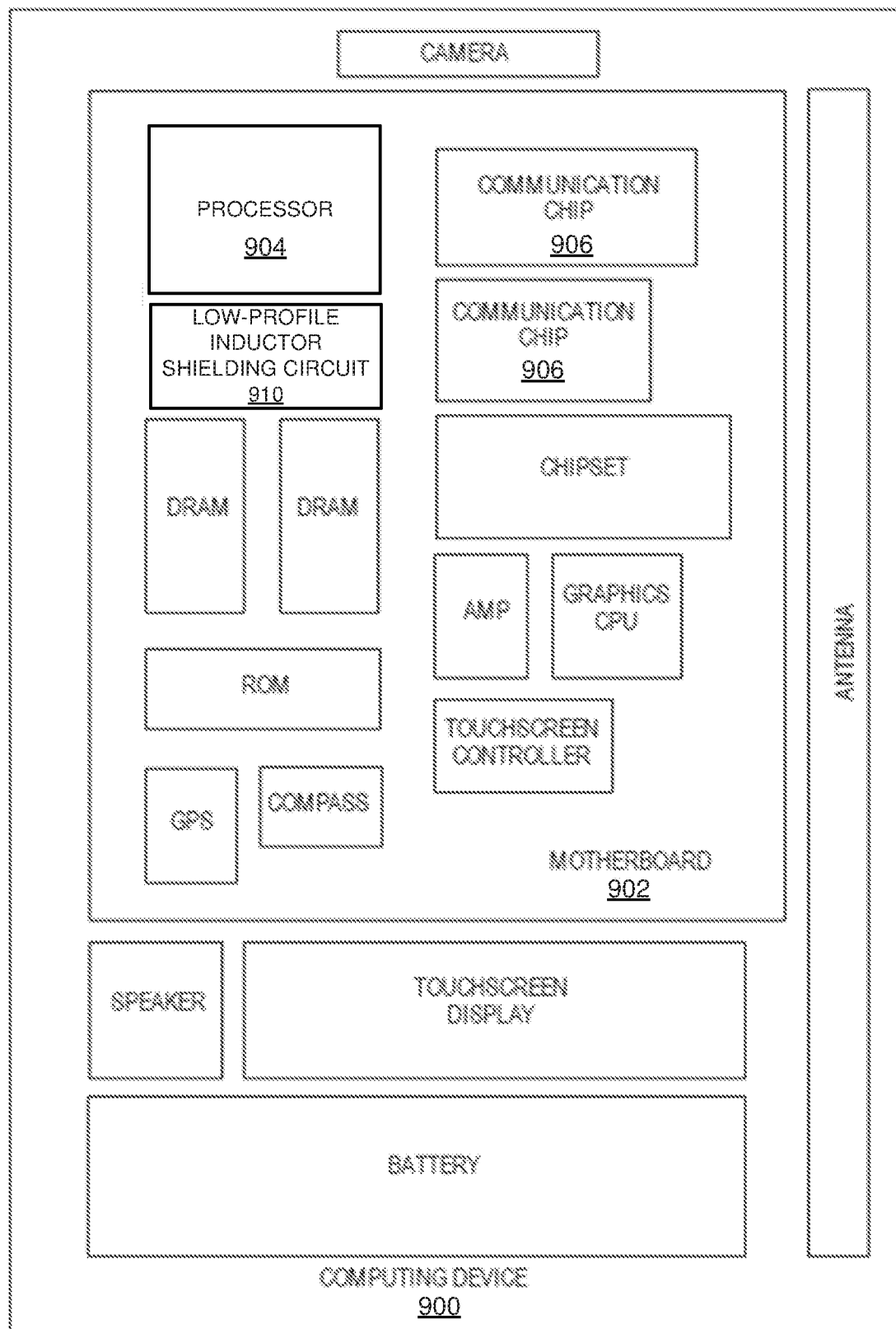
FIG. 9 is a schematic block diagram illustrating a computer system that utilizes a foundation layer with a low-profile inductor shield, according to one embodiment.

FIG. 9 illustrates an example of computing device 900. Computing device 900 houses motherboard 902. For most embodiments, motherboard 902 is similar to motherboard 201 of FIGS. 2A-C. Motherboard 902 may include a number of components, including but not limited to processor 904, low-profile inductor shielding circuit 910, and at least one communication chip 906. Motherboard 902 may also be formed to implement the low-profile inductor shielding process, as described herein. For example, motherboard 902 may include similar components as shown in FIG. 2B.

Processor 904 is physically and electrically coupled to motherboard 902. For some embodiments, at least one communication chip 906 is also physically and electrically coupled to motherboard 902. For other embodiments, at least one communication chip 906 is part of processor 904.

Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die (e.g., semiconductor die 204 of FIG. 2B) packaged within processor 904. Low-profile inductor shielding circuit 910 may be implemented near the integrated circuit die packaged within processor 904 to suppress EMI and RFI. For some embodiments, low-profile inductor shielding circuit 910 may be used to implement the low-profile inductor shielding process, as described herein. For example, low-profile inductor shielding circuit (or component) 910 may include similar components as shown in FIGS. 2B-C.

For certain embodiments, the integrated circuit die may be packaged with one or more devices on a foundation layer (or a package substrate) that includes a thermally stable RFIC and antenna for use with wireless communications and one or more of the low-profile inductor shielding components, as described herein, to mitigate EMI/RFI noise and improve electrical performance The term "processor" may refer to any device or portion of a device that processes electronic data from registers and/or memory to transform that electronic data into other electronic data that may be stored in registers and/or memory.

At least one communication chip 906 also includes an integrated circuit die packaged within the communication chip 906. For some embodiments, the integrated circuit die of the communication chip may be packaged with one or more devices on a foundation layer (or a package substrate) that includes one or more of the low-profile inductor shielding components, as described herein, to mitigate EMI/RFI noise and improve electrical performance.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

For some embodiments, a semiconductor package includes a foundation layer; a conductive layer formed in the foundation layer; and a magnetic layer formed between the conductive layer and the foundation layer, wherein the conductive layer and the magnetic layer are coupled to form a low-profile inductor shield.

For one embodiment, the semiconductor package further comprising a dielectric layer formed between the magnetic layer and the foundation layer.

For one embodiment of the semiconductor, wherein the low-profile inductor shield includes one or more solder pads that are coupled to the conductive layer.

For one embodiment of the semiconductor, wherein the foundation layer further includes at least one of a voltage regulator and an inductor, and wherein the inductor is located above the low-profile inductor shield.

For one embodiment of the semiconductor, wherein the foundation layer further includes one or more vias and a ground via, and wherein the conductive layer is coupled to the one or more vias and the ground via.

For one embodiment, the semiconductor package further comprising a motherboard, a hole in motherboard of the motherboard, and a semiconductor die, wherein the semiconductor die is mounted to the foundation layer.

For one embodiment of the semiconductor, wherein the foundation layer is mounted between the motherboard and the semiconductor die, and wherein the foundation layer is attached to the motherboard with a plurality of solder balls.

For one embodiment of the semiconductor, wherein the low-profile inductor shield comprises a z-height that is less than a z-height of the plurality of solder balls.

For one embodiment of the semiconductor, wherein the low-profile inductor shield is formed on the foundation layer to suppress an electromagnetic interference and a radio frequency interference.

For one embodiment of the semiconductor, wherein the foundation layer is a printed circuit board.

For some embodiments, a method of forming a semiconductor package, comprising: mounting a foundation layer over a motherboard; forming a conductive layer on the foundation layer; and forming a magnetic layer between the conductive layer and the foundation layer, wherein the conductive layer and the magnetic layer are coupled to form a low-profile inductor shield.

For one embodiment, the method further comprising forming a dielectric layer between the magnetic layer and the foundation layer.

For one embodiment of the method, wherein the low-profile inductor shield includes one or more solder pads that are coupled to the conductive layer.

For one embodiment of the method, wherein the foundation layer further includes at least one of a voltage regulator and an inductor, and wherein the inductor is located above the low-profile inductor shield.

For one embodiment of the method, wherein the foundation layer further includes one or more vias and a ground via, and wherein the conductive layer is coupled to the one or more vias and the ground via.

For one embodiment, the method further comprising a motherboard, a hole in motherboard of the motherboard, and a semiconductor die, wherein the semiconductor die is mounted to the foundation layer.

For one embodiment of the method, wherein the foundation layer is mounted between the motherboard and the semiconductor die, and wherein the foundation layer is attached to the motherboard with a plurality of solder balls.

For one embodiment of the method, wherein the low-profile inductor shield comprises a z-height that is less than a z-height of the plurality of solder balls.

For one embodiment of the method, wherein the low-profile inductor shield is formed on the foundation layer to suppress an electromagnetic interference and a radio frequency interference.

For one embodiment of the method, wherein the foundation layer is a printed circuit board.

For some embodiments, a semiconductor package, comprising: a foundation layer; a conductive layer formed in the foundation layer; a magnetic layer formed between the conductive layer and the foundation layer; and a magnetic inductor array (MIA) embedded within the magnetic layer, wherein the conductive layer, the magnetic layer, and the magnetic inductor array are coupled to form a low-profile inductor shield.

For one embodiment of the semiconductor package, wherein the low-profile inductor shield includes one or more MIA pads and one or more solder pads, wherein the one or more solder pads are coupled to the conductive layer, wherein the one or more MIA pads are coupled to the MIA, and wherein the low-profile inductor shield is mounted below the foundation layer.

For one embodiment of the semiconductor package, wherein the foundation layer further includes at least one of a voltage regulator and an inductor.

For one embodiment of the semiconductor package, wherein the foundation layer further includes one or more vias and a ground via, and wherein the conductive layer is coupled to the one or more vias and the ground via.

For one embodiment, the semiconductor package further comprising a motherboard, a hole in motherboard of the motherboard, a semiconductor die, wherein the semiconductor die is mounted to the foundation layer, wherein the foundation layer is mounted between the motherboard and the semiconductor die, wherein the foundation layer is attached to the motherboard with a plurality of solder balls, and wherein the low-profile inductor shield comprises a z-height that is less than a z-height of the plurality of solder balls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a foundation layer;
   a conductive layer formed on the foundation layer; and
   a magnetic layer formed between the conductive layer and the foundation layer, wherein the conductive layer and the magnetic layer are coupled to form a low-profile inductor shield.

2. The semiconductor package of claim 1, further comprising a dielectric layer formed between the magnetic layer and the foundation layer.

3. The semiconductor package of claim 1, wherein the low-profile inductor shield includes one or more solder pads that are coupled to the conductive layer.

4. The semiconductor package of claim 1, wherein the foundation layer further includes at least one of a voltage regulator and an inductor, and wherein the inductor is located above the low-profile inductor shield.

5. The semiconductor package of claim 1, wherein the foundation layer further includes one or more vias and a ground via, and wherein the conductive layer is coupled to the one or more vias and the ground via.

6. The semiconductor package of claim 1, further comprising a motherboard, a hole in motherboard of the motherboard, and a semiconductor die, wherein the semiconductor die is mounted to the foundation layer.

7. The semiconductor package of claim 6, wherein the foundation layer is mounted between the motherboard and the semiconductor die, and wherein the foundation layer is attached to the motherboard with a plurality of solder balls.

8. The semiconductor package of claim 7, wherein the low-profile inductor shield comprises a z-height that is less than a z-height of the plurality of solder balls.

9. The semiconductor package of claim 1, wherein the low-profile inductor shield is formed on the foundation layer to suppress an electromagnetic interference and a radio frequency interference.

10. The semiconductor package of claim 1, wherein the foundation layer is a printed circuit board.

11. A method of forming a semiconductor package, comprising:
    mounting a foundation layer over a motherboard;
    forming a conductive layer on the foundation layer; and
    forming a magnetic layer between the conductive layer and the foundation layer, wherein the conductive layer and the magnetic layer are coupled to form a low-profile inductor shield.

12. The method of claim 11, further comprising forming a dielectric layer between the magnetic layer and the foundation layer.

13. The method of claim 11, wherein the low-profile inductor shield includes one or more solder pads that are coupled to the conductive layer.

14. The method of claim 11, wherein the foundation layer further includes at least one of a voltage regulator and an inductor, and wherein the inductor is located above the low-profile inductor shield.

15. The method of claim 11, wherein the foundation layer further includes one or more vias and a ground via, and wherein the conductive layer is coupled to the one or more vias and the ground via.

16. The method of claim 11, further comprising mounting a semiconductor die to the foundation layer.

17. The method of claim 16, wherein the foundation layer is mounted between the motherboard and the semiconductor die, and wherein the foundation layer is attached to the motherboard with a plurality of solder balls.

18. The method of claim 17, wherein the low-profile inductor shield comprises a z-height that is less than a z-height of the plurality of solder balls.

19. The method of claim 11, wherein the low-profile inductor shield is formed on the foundation layer to suppress an electromagnetic interference and a radio frequency interference.

20. The method of claim 11, wherein the foundation layer is a printed circuit board.

21. A semiconductor package, comprising:
    a foundation layer;
    a conductive layer formed on the foundation layer;
    a magnetic layer formed between the conductive layer and the foundation layer; and
    a magnetic inductor array (MIA) embedded within the magnetic layer, wherein the conductive layer, the magnetic layer, and the magnetic inductor array are coupled to form a low-profile inductor shield.

22. The semiconductor package of claim 21, wherein the low-profile inductor shield includes one or more MIA pads and one or more solder pads, wherein the one or more solder pads are coupled to the conductive layer, wherein the one or more MIA pads are coupled to the MIA, and wherein the low-profile inductor shield is mounted below the foundation layer.

23. The semiconductor package of claim 21, wherein the foundation layer further includes at least one of a voltage regulator and an inductor.

24. The semiconductor package of claim 21, wherein the foundation layer further includes one or more vias and a ground via, and wherein the conductive layer is coupled to the one or more vias and the ground via.

25. The semiconductor package of claim 21, further comprising a motherboard, a hole in motherboard of the motherboard, a semiconductor die, wherein the semiconductor die is mounted to the foundation layer, wherein the foundation layer is mounted between the motherboard and the semiconductor die, wherein the foundation layer is attached to the motherboard with a plurality of solder balls, and wherein the low-profile inductor shield comprises a z-height that is less than a z-height of the plurality of solder balls.

* * * * *